United States Patent [19]
Todd

[11] Patent Number: 5,174,016
[45] Date of Patent: Dec. 29, 1992

[54] CHIP REMOVAL APPARATUS AND METHOD OF USING SAME

[75] Inventor: Thomas W. Todd, San Diego, Calif.

[73] Assignee: Toddco General, Inc., San Diego, Calif.

[21] Appl. No.: 691,549

[22] Filed: Apr. 25, 1991

[51] Int. Cl.[5] ............................................. B23P 19/00
[52] U.S. Cl. ..................................... 29/762; 228/191; 228/264
[58] Field of Search ............... 29/762, 740, 701, 703, 29/704; 228/191, 264

[56] References Cited

U.S. PATENT DOCUMENTS

| | | | |
|---|---|---|---|
| 4,179,803 | 12/1979 | Wolkert | 29/741 |
| 4,521,959 | 6/1985 | Sprenkle | 29/741 |
| 4,528,746 | 7/1985 | Yoshimura | 228/264 X |
| 4,586,252 | 5/1986 | Faticanti | 29/762 |
| 4,799,617 | 1/1989 | Friedman | 228/191 X |
| 4,817,273 | 4/1989 | Lape et al. | 29/741 |
| 4,828,162 | 5/1989 | Donner et al. | 29/762 X |
| 4,934,582 | 6/1990 | Bertram et al. | 228/264 X |
| 5,065,933 | 11/1991 | Basavanhally | 228/264 X |
| 5,072,874 | 12/1991 | Bertram et al. | 228/264 |

FOREIGN PATENT DOCUMENTS

| | | | |
|---|---|---|---|
| 1943393 | 3/1971 | Fed. Rep. of Germany | 228/191 |
| 3009518 | 9/1981 | Fed. Rep. of Germany | 29/762 |
| 2418992 | 11/1979 | France | 29/762 |
| 0006459 | 1/1981 | Japan | 29/762 |
| 0264293 | 10/1989 | Japan | 29/762 |

OTHER PUBLICATIONS

IBM Technical Disclosure Bulletin, "Chip Removal Method", vol. 31, No. 11, p. 214, Apr. 1989.
Insulation/Circuits, "Desolder and remove Dip's in one motion", vol. 22, No. 9, pp. 39-41, Aug. 1976.

Primary Examiner—Timothy V. Eley
Assistant Examiner—C. Richard Martin
Attorney, Agent, or Firm—Bernard L. Kleinke; Jerry R. Potts; William Patrick Waters

[57] ABSTRACT

A chip removal method and apparatus for use with a robotic unit. The chip removal apparatus includes a heated center quill and a soldering unit which cooperate together with a chip removal tool for simultaneously disabling the bonding materials securing a chip to a printed circuit board. The method permits the fine pitch chip device to be removed from the printed circuit board substantially intact for subsequent testing purposes.

20 Claims, 3 Drawing Sheets

CHIP REMOVAL APPARATUS AND METHOD OF USING SAME

CROSS REFERENCE TO RELATED APPLICATIONS

Co-pending U.S. patent applications, entitled "ROBOTIC TOOL ADAPTER APPARATUS AND METHOD OF USING SAME," filed Feb. 19, 1990 assigned Ser. No. 07/657,563 and "ROBOTIC ARM TOOL MOUNTING APPARATUS AND METHOD OF USING SAME," filed Feb. 19, 1990 assigned Ser. No. 7/657,564, are hereby incorporated herein by reference, as if fully set fort herein.

TECHNICAL FIELD

This invention relates in general to a chip removal system and a method of using it. It more particularly relates to a system for facilitating in a more reliable manner operations, such as for fine pitch integrated circuit devices.

BACKGROUND ART

There have been many different types and kinds of mass production techniques for mounting surface mount devices, such as an integrated circuit device, to a printed circuit board. One such technique is a hot bar reflow soldering system. In this system, the surface mount devices to be installed are transported from one location to another during the course of assembling them in the desired locations on a printed circuit board.

Such reflow soldering systems typically employ pick and place systems operated under the control of a robotic unit to retrieve the devices seriatim from one location, and then position them at desired locations on the printed circuit board, so they may be affixed thereto by suitable bonding techniques, such as adhesive and reflow soldering techniques. An important aspect of such surface mount technology includes the removal of such devices intact from the printed circuit board in the event of device failure. In this regard, if the flimsy lead bearing type of the devices are ripped or torn or if the closely spaced leads of the miniature devices are damaged during removal from the printed circuit board, the devices can not be priory tested for determining failure causes. Moreover, if residue device debris, such as lead or tape debris, remains affixed to the printed circuit board, time consuming cleaning operations can result. Thus, costly and unwanted quality control and claiming operations can result.

While such prior known systems have been satisfactory for mounting integrated circuit devices to printed circuit boards, the problems experienced in damaging such devices when they are removed from the printed circuit board have occurred all too frequently. In this regard, in removing the device from the printed circuit board all too often the device or the leads of the device are damaged.

One attempted solution to solve the above-mentioned problem, has been the use of a solder wick, such as disclosed in U.S. Pat. No. 4,934,582 to remove excess solder from the leads of the device to facilitate its removal from the printed circuit board. While the solder wick technique helps to remove solder from the leads of the device, the technique does not entirely eliminate device and board damage particularly when attempting the removal of a fine pitch device to the printed circuit board pads. In this regard, in order to protect fine pitch devices from damage when they are initially being mounted to the printed circuit board, a heat sink or a heat sink type binder with hub metal content is utilized for dissipating thermal energy away from the device. Such a binder however adheres the body of the integrated circuit device to the printed circuit board. Thus, even if solder from the outer leads of the devices is removed the miniature body of the device with its small delicate and closely spaced inner leads still remains adhered to the printed circuit board.

Another attempt to solve the above-mentioned problem has been the use of a hot bar and tweezers to detach the body of the device form the printed circuit board. This technique has proven to be less than satisfactory. In this regard, while using a hot bar on top of the integrated circuit device loosen the bond of the adhesive, the thermal energy transferred through the device all too often damages its delicate circuits. Moreover, even if the delicate circuits are not damaged using the tweezers to remove the device from the printed circuit board is microscopic time consuming tedious work and many times results in the delicate leads of the device being damaged by the tongs of the tweezers.

Still yet another attempted solution to solve the above mentioned problem has been the use of a vacuum actuated center quill device to grip the body of the integrated circuit device once the body has been sufficiently heated to loosen the bonding material. In this regard, when the bonding material is loosened, the center quill grips the body holding it firmly as a robotic unit attached to the center quill moves the center quill away from the device causing the device to be removed from the printed circuit board. While this technique has proven satisfactory with larger integrated devices, it has proven less than satisfactory with the smaller fine pitch devices because the smaller body surface areas of such devices is generally so small, that the vacuum actuated center quill loses its ability to sufficiently grab the device so that it may be lifted from the printed circuit board.

Therefore, it would be highly desirable to have a new and improved chip removal method and system for detaching an integrated circuit device from a printed circuit board. Such a system and method should greatly reduce, or even substantially eliminate damaging the integrated circuit device during removal, so that the device may be tested after removal for determining primary device failure cause. Moreover, such a method and system should not only be highly effective, but it should also be efficient, by enabling both large and small fine pitch devices to be picked up intact directly from the printed circuit board and mounted for easy testing purposes.

DISCLOSURE OF INVENTION

Therefore, the principal object of the present invention is to provide a new and improved removal system, which enables a circuit device to be removed intact from a printed circuit board.

Another object of the present invention is to enable the device to be picked up directly from a printed circuit board without damaging the circuits of the device or its delicate closely spaced apart fine pitch leads.

Still yet another object of the present invention is to enable the removal of the device from the printed circuit board to be accomplished in a relatively fast and efficient manner.

Another object of the present invention is to remove the device from the printed circuit board in such a manner, that the device once removed from the printed circuit board, can be easily tested for failure causes.

Briefly, the above and further objects of the present invention are realized in accordance with the present invention by providing a robotic controlled chip removal system and method that enables a fine pitch integrated circuit device to be removed from a printed circuit board in a substantially intact manner without damaging the circuits of the device or its delicate inner and outer leads.

The chip removal system includes a chip removal apparatus for use with a robotic unit. The chip removal apparatus includes a soldering head assembly having a heated center quill for sufficiently disabling the binding characteristic of the heat set type binder securing the body portion of a fine pitch device to a printed circuit board as well as a plurality of thermode blades for reflowing solder bonding the leads of the device. In this regard, the two bonding agents are simultaneously disabled so that the device may be removed intact from the printed circuit board without damaging the device leads or circuits. The soldering head assembly also includes a spring loaded chip removal tool carrier adapted for holding a chip removal tool to help facilitate the removal of the fine pitch device from the printed circuit board. The chip removal tool is adapted for securing or gripping the fine pitch device so that it may be removed from the printed circuit board.

In one form of the invention, the chip removal tool also includes a plurality of solder wicks for helping to facilitate the removal of excess solder from the outer leads of the fine pitch device. Thus, removal of the fine pitch device can be achieved in a fast and efficient manner without damaging the fine pitch device.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

Figure 1:
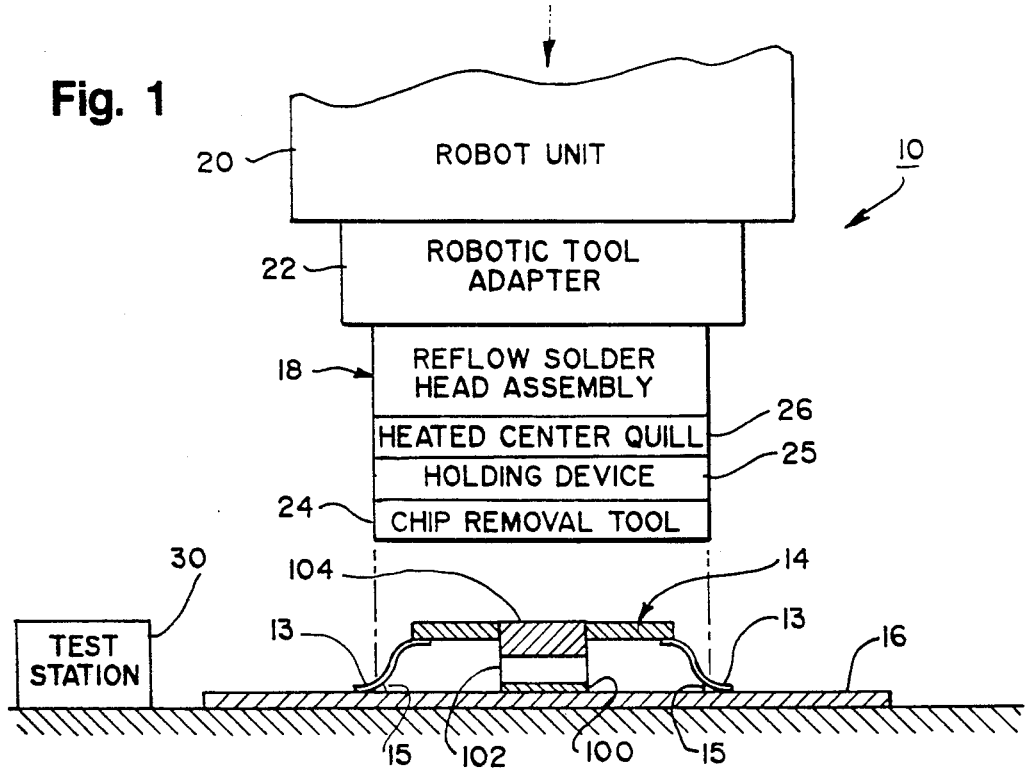
FIG. 1 is a diagrammatic view of a chip removal system, including a robotically controlled reflow solder head assembly having a chip removal tool, which system, head and tool are each constructed in accordance with the present invention and which is shown operatively associated with a printed circuit board assembly, a robotic tool adaptor, and a robotic control unit shown fragmentally, for illustrative purposes.

Referring now to the drawings, and more particularly to FIG. 1 thereof, there is shown a chip removal system 10 which is constructed in accordance with the present invention. The system 10 of the present invention enables a circuit device or chip, such as an integrated circuit device 14 to be removed from a printed circuit board, such as printed board 16 in a substantially intact manner, thereby enabling quality control testing of the device 14 after removal by eliminating or at least greatly reducing damage to the delicate circuits and leads of the device 14. The system 10 includes a reflow solder head assembly 18 having a plurality of thermode blades, such as blades 28 and 29 (FIG. 2 and a heated center quill 26. The reflow solder head assembly 18 is constructed to be mounted to a robotic unit 20 by a robotic tool adapter 22, both of which form part of the chip removal system 10. The soldering system 10 includes a chip removal tool 24 adapted to be mounted to the reflow solder head assembly 18 and positioned to engage the device 14 when the robotic unit 20 moves the reflow solder head 18 into engagement with the printed circuit 16. In this regard, the reflow solder head assembly 18, the chip removal tool 24, and the heated center quill 26 cooperate together under the control of the robotic unit 20 to secure the device 14 to the chip removal tool 24 and to cause the bonding materials securing the device 14 to the printed circuit board 16 to be temporarily disabled. In this manner, once the bonding materials have been temporarily disabled, the robotic unit 20 and the printed circuit board 16 can be moved away from one another causing the device 14 to be removed from the printed circuit board 16 in a fast and efficient manner without damaging the device 14.

As will be explained hereinafter in greater detail, the chip removal tool 24 generally comprises a sheet of chip removal material 600 and a carrier device 500 for releasably holding or clamping the sheet of chip removal material 600 therewithin. The sheet of chip removal material 600 is disposable after use in removing the chip 14 from the printed circuit board 16.

In operation, after the chip removal tool 24 has been mounted to the reflow solder head assembly 18, the robotic unit 20 causes the leads of the device 14 to be engaged by the solder head assembly thermode blades, such as the thermode blades 28 and 29. In this regard, the robotic unit 20 causes the reflow solder head assembly 18 to be moved toward the printed circuit board 16 a sufficient distance to permit the chip removal tool 24 to engage the top surface of the device 14, and to permit thermode blades 28 and 29 to pass through a sheet of chip removal material, such as the sheet 600 (FIG. 4) to engage the leads 13 of the printed circuit board 16. Subsequently after the blades 28 and 29 have engaged the leads 13 of the printed circuit board 16, the robotic unit 20 causes the center quill 26 to be brought into engagement with the sheet of chip removal material 600 with a sufficient amount of force to press the material 600 against a chip coating material 104 disposed the top surface of a body portion 102 of the device 14. Once the center quill 26 has engaged the material 600, the temperature of the quill 26 is raised a sufficient amount to cause a portion of the material 600 to liquify or melt onto the chip coating portion 104 of the chip 14.

Subsequently, the temperature of the center quill 26 is lower a sufficient amount to permit the material 600 to solidify, thus bonding the material 600 to the top surface of the device 14 as well as to the center quill 26. After the material 600 has solidified, the temperature of the center quill 26 is raised a sufficient amount to cause an adhesive heat set type bonding material, such as a paste adhesive or film adhesive shown generally at 100 disposed beneath the body 102 of the device to be temporarily disabled. Although this subsequent temperature is sufficient to disable the adhesive 100, it is not a sufficiently high temperature to cause the material 600 to again be liquified or melted. Subsequent to the bonding material being disabled, the thermode blades 28 and 29 are raised to soldering temperatures causing a solder material 15 bonding the leads 13 of the device 14 to the printed circuit board 16 to liquify. Simultaneously with the liquification of the solder material 15, the robotic unit 20 and printed circuit board 16 are moved rectilinearly away from one another permitting the device 14 to be removed substantially intact from the printed circuit board 16. The robotic unit 20 then causes the device 14 to be transported to a testing station 30. Once the device 14 has been transported to the testing station 30, the temperature of the center quill 26 is raised an additional amount causing the material 600 to liquify and thus, releasing the device 14 from the heated center quill 16. Subsequent to the device 14 being separated from the center quill, the device 14 with the sheet of material 600 bonded thereto, may be removed from the carrier device 50 for subsequent testing purposes at a test station 30.

Figure 2:
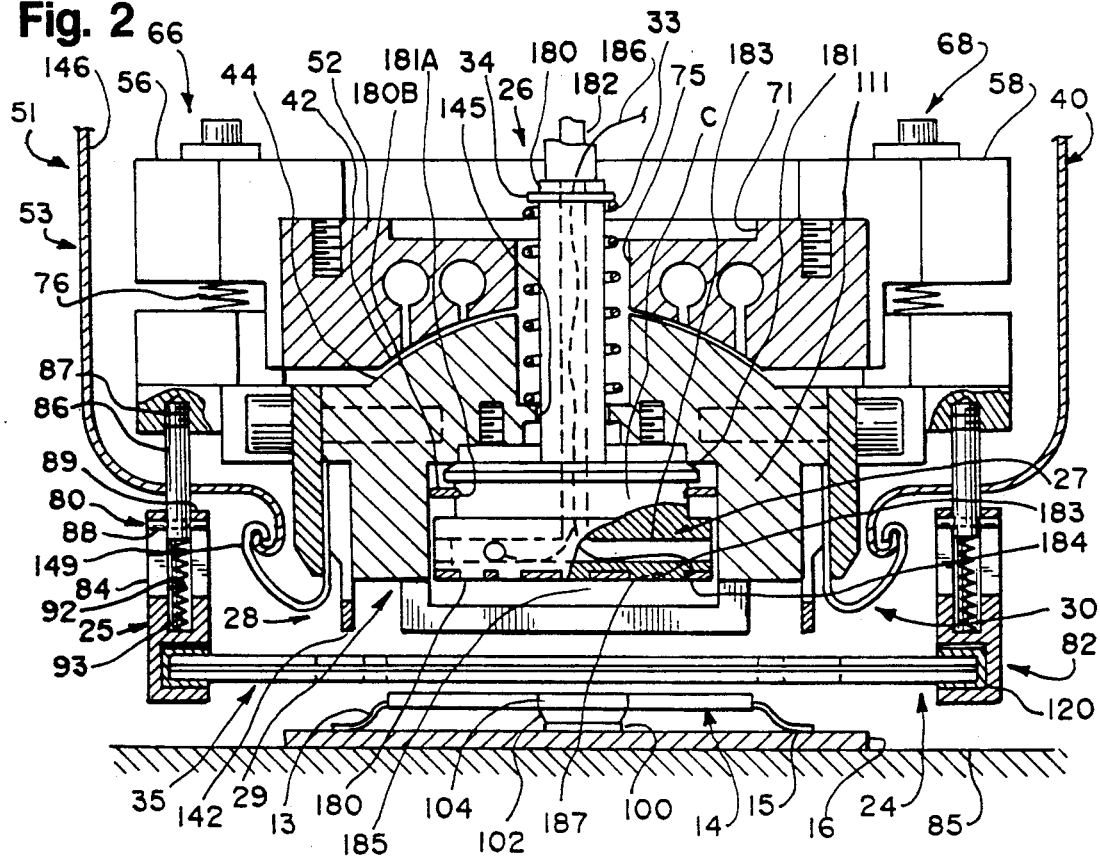
FIG. 2 is a partially diagrammatic longitudinal sectional view of the reflow solder head of FIG. 1.
Figure 3:
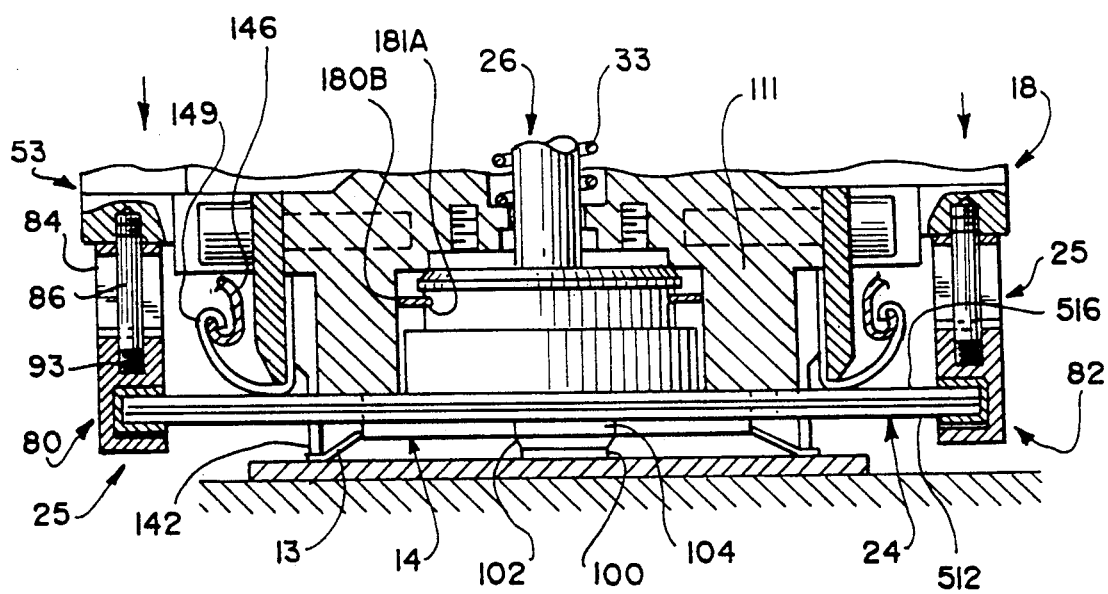
FIG. 3 is a partly diagrammatic longitudinal section view of the reflow soldering head of FIG. 1, shown engaging the circuit board assembly for illustrative purposes.

Considering now the chip removal system 10 in greater detail with reference to FIGS. 1-3, the reflow solder head assembly 18 is substantially similar to the reflow solder head assembly described in copending U.S. Pat. application Ser. No. 07/657,564 except that it also includes a movable holder or mounting assembly 25 for mounting the chip removal tool 24 to the head assembly 18 and the heated center quill 26 for helping to hold the printed circuit device 14 for removal from the printed circuit board 16. The reflow solder head assembly 18 also includes a soldering unit 35 for engaging the leads 13 of the circuit device 14 in order to cause soldering material bonding the leads 13 to the board 16 to be liquified for chip removal purposes.

The reflow solder head assembly 18 is adapted to be attached removably to the robotic unit 20 through the robotic tool adaptor 20, each forming part of the chip removal system 10. The robotic unit 20 and the robotic tool adaptor 22 are more fully described in the above mentioned copending U.S. Pat. application Ser. No. 07/657,564.

As explained in more detail in copending U.S. Pat. application Ser. No. 07/657,564, the reflow soldering head assembly 18 is an over-center device adapted to couple the downwardly directed forces of the robotic unit 20 in an evenly distributed manner to the circuit device 14. In this regard, the reflow solder head assembly 18 includes an air activated gimballed joint, shown generally at 40 for reducing, if not eliminating entirely, unwanted and undesired x-y axial shifts in the robotic unit 20 for complying with a non-coplanar printed circuit board. The gimballed joint 40 enables the soldering unit 35 to move in a pivoting rotatable manner for maintaining proper tolerance control without the need for x-y axial shifts in the robotic unit 18.

Considering now the integrated reflow soldering head assembly 18 in greater detail with reference to FIGS. 1-3, the head assembly 18 includes an upper head section, shown generally at 51, and a lower head section shown generally at 53. The upper head section 51 and the lower head section 53 are mounted movably together to facilitate a rotating pivotable rocking motion. In this regard, the upper head section 51 is mounted fixably to the robotic tool adapter 22 by means (not shown), while the lower head section 53 is mounted movably relative to the upper head section 51 as will be explained hereinafter in greater detail.

For the purpose of helping to facilitate the rotative pivotal rocking movement of the lower head section 53 relative to the upper head section 51, the upper head section 51 includes a centrally disposed truncated semi-circular recess or socket 42 that is dimensioned to receive a complimentary shape centrally disposed protuberance 44 extending upwardly from the upper surface of the lower head section 53. The socket 42 and the protuberance 44 cooperate together to define the gimballed universal joint, shown generally at 40.

Considering now the upper head section 51 in greater detail with reference to FIGS. 2-3, the upper head section 51 generally has a unitary construction and is composed of a light weight metallic material, such as aluminum for helping to minimize the load carried or supported by the robotic unit 20. The upper head section 51 includes a flat rectangularly shaped body portion 52 and a set of four integrally connected outwardly projecting raised arms, such as arms 56 and 58. As will be explained hereinafter in greater detail, the arms such as arms 56 and 58, are adapted to receive and support a corresponding set of spring assemblies, such as assemblies 66 and 68 respectively. Each of the spring assemblies, such as assembly 66 includes a spring, such as spring 76, mounted removably between the upper head section 51 and the lower head section 53 for helping to facilitate their relative movement and for suspending resiliently the lower head section 53 from the upper head section 51 in a movable manner.

Considering now the body portion 52 of the upper head section 51 in greater detail with reference to FIG. 2, the body portion 52 includes a large centrally disposed annular recess 71 in its upper surface with a centrally disposed annular bore 75 therein for receiving a portion of the holding assembly 25.

Considering now the lower head section 53 in greater detail with reference to FIGS. 2 and 3, the lower head section 53 generally has a unitary construction is composed of a light weight metallic material such as aluminum for helping to minimize the load carried or supported by the robotic unit 20. As will be explained hereinafter in greater detail, both the holding assembly 25 and the soldering unit 35 are adapted to be secured removably to the lower head section 53.

Considering now the heated center quill 26 in greater detail with reference to FIGS. 1 and 2, the center quill 26 includes the heating unit 27 for liquefying the chip removal tool 24 and a pneumatic actuator 27 for causing the heating unit 27 to be moved rectilinearly toward and away from the printed circuit board 16. The actuator 27 generally includes an elongated upward tube portion 180 integrally connected to a lower portion 181. An annular groove 181A disposed in a lower portion 181 is adapted to receive an air seal such as an air seal 180B. The air seal 180B is mounted to a lower section 111 of the lower head section 53 and forms an air tight chamber C. The elongated upper tube section 180 is dimensioned to be snugly received within a small annular opening 145. The tube portion 180 is of sufficient length to extend upwardly beyond the outer surface of the lower head section 53 and includes a groove (not shown) at its upper end to facilitate securing the center quill 26 as will be explained hereinafter in greater detail.

For the purpose of supporting the upper tube portion 180 in the opening 145, a compression spring 33 surrounds the upper tube section 180 and extends between the base of the opening 145 to slightly above the top surface of the lower head section 53. A retaining clip 34 secures the spring 33 in the opening 145 and also secures the heated center quill 26 in the opening 145.

As best seen in FIGS. 2 and 3, the heating unit 27 includes a hollow elongated cylindrical section 182 inwardly connected to a generally annularly shaped base section 183 having a plurality of heating elements or coils, such as the coils 184 and 185. The coils are coupled electrically by a conductor 186 to a high current source (not shown) through the robotic unit 20 as will be explained hereinafter in greater detail. The base section 183 is composed of a light weight material, such as aluminum and includes a smooth flat bottom surface 180 for engaging a large surface area of the chip removal tool 24. In this regard, when the bottom or undersurface 180 is adjacent to and resting against the tool 24, the heating elements radiate a sufficient amount of heat to transfer thermal energy to the electronic device 14 as well as to the printed circuit board 16 in a very localized area. In order to permit larger integrated circuit devices (not shown) to be removed from a printed circuit board without the utilization of the chip removal tool 24, the base section 183 also includes a plurality of openings, such as opening 187. In this regard, a vacuum pressure is provided by the robotic unit 20 to permit the base section 183 to firmly hold a chip.

Considering now the soldering unit 25 in greater detail with reference to FIGS. 1-3 the soldering unit 35 generally comprises a set of thermal units, such as the thermal units 28, 29 and 30. The thermal units 28-30 apply heat to the leads 13 of the circuit device 14 and the pads 15 of the printed circuit board 16 respectively, for causing solder predeposited on the pads to reflow. As each of the reflow units 28-30 are substantially identical, only thermal unit 28 will be described hereinafter in greater detail.

As best seen in FIGS. 2 and 3, the thermal unit 28 generally includes an elongated thermal blade 142 for transferring thermal energy to a liquify solder predeposited on the pads 15 of the printed circuit board 16. The thermal blade 142 is composed of a thermally conductive electrically insulative material, such as a ceramic material, for electrically isolating the leads 13 of the circuit device 14 from the high current energy utilized to raise the temperature of the thermal unit 28 to solder reflow temperatures. The thermal unit 28 is coupled to the high current source by an insulated braided copper cable 146 and a thin flat electrical conductor 149. It should be understood that other types and kinds of blades well known to those skilled in the art may also be utilized.

Figure 5:
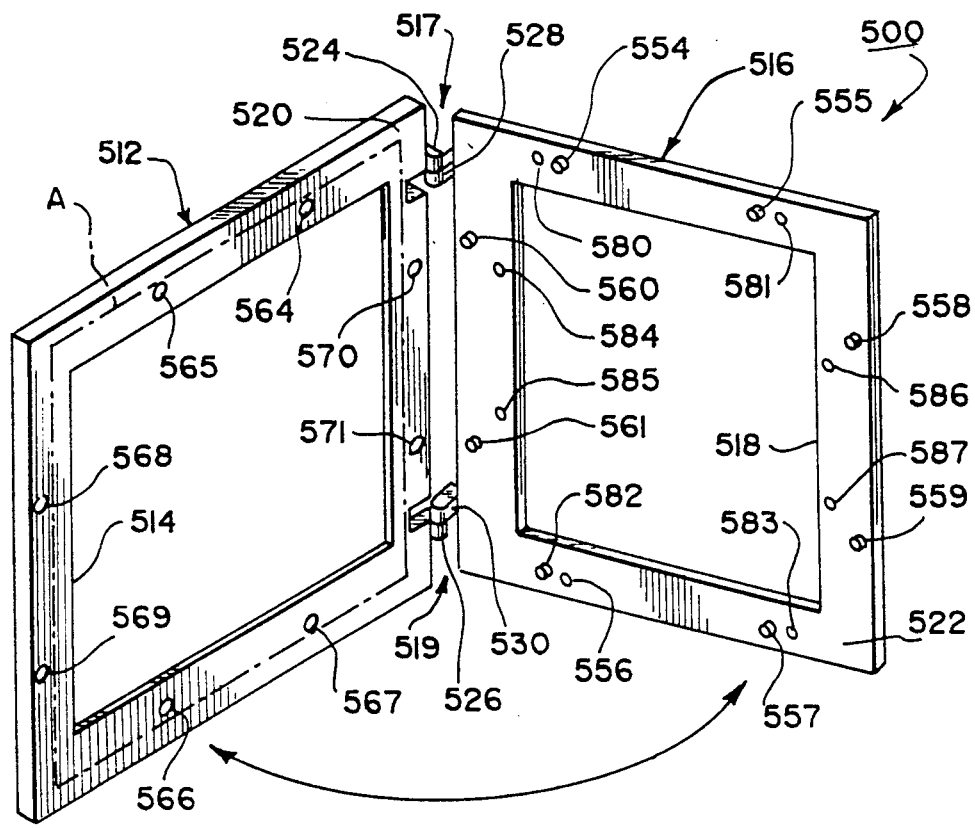
FIG. 5 is a pictorial view of a carrier device for releasably holding the sheet of chip removal material of FIG. 4.

Considering now the holding assembly 25 in greater detail with reference to FIGS. 2, 3 and 5, the holding assembly 25 generally comprises a set of mounting units, such as mounting units 80 and 82, for mounting the chip removal tool 24 to the reflow solder head assembly 18. As each of the mounting units, such as units 80 and 82 are substantially identical only mounting unit 80 will be described hereinafter in greater detail.

Considering now mounting unit 80 in greater detail with reference to FIGS. 2, 3 and 5, the mounting unit 80 generally comprises a tool receiving member 84 for supporting the chip removal tool in a substantially horizontal plane, parallel to a supporting surface 85 for the printed circuit board 16. The tool receiving member 84 is mounted to the reflow solder head assembly 18 by a threaded post 86 adapted to be threadably received within a threaded bore 87 disposed in the lower head section 53. The post 86 includes a traverse hole 88 disposed adjacent to its lower terminal end. The hole 88 is adapted to receive a support pin 89 therein for supporting the tool receiving member 84 from the post 86.

Considering now the tool receiving member 84 in greater detail with reference to FIGS. 2, 3 and 5, the tool receiving member 84 includes a centrally disposed bore 92 that is dimensioned to receive therein the post 86 and a compression spring 93. The bore 92 is of sufficient longitudinal length to receive a substantial portion of the post as will be explained hereinafter in greater detail. The tool receiving member 84 also includes a traverse slot 94 which is dimensioned to receive an end portion of a carrier device 120 forming part of chip removal tool 24.

Considering now the operation of the holding unit 25 in greater detail with reference to FIGS. 2 and 3, as the robotic unit 20 causes the reflow solder head assembly 18 to move rectilinearly downwardly, the chip removal tool 24 comes into resting contact with the upper surface of the device 14. In this regard, as the robotic unit 20 continues to cause the assembly 18 to move downwardly, the post 86 moves downwardly into the bore 92 causing the spring 93 to be compressed therewithin.

As best seen in FIG. 3, as the robotic unit 20 causes the assembly 18 to continue in a downward path of travel, the post 86 is substantially received within the bore 92 causing the spring 93 to be fully compressed within the bore 92. When the spring 93 is brought into substantially full compression with the blade 142 engaging the leads 13, the robotic unit 20 terminates the downward movement of the assembly 18.

Subsequently, after the device 14 has been released from the printed circuit board 16, the robotic unit 20 causes the assembly 18 to be moved rectilinearly upwardly away from the printed circuit board 16 which in turn, causes the device 14 to be removed from the printed circuit board 16. The robotic unit 20 then causes the assembly 18 to be moved to the test station 30. After the assembly 18 has been positioned at the test station 30, the temperature of the heated center quill 26 is raised a sufficient amount to cause the material 600 to be liquified thus releasing the center quill 26 from the device 14. In this regard, once the center quill 26 is released, the springs in the holding assembly 25, such as spring 93, expand causing the tool receiving members, such as member 84 to move abruptly away to their initial loading positions. Thus, the carrier device 500 is positioned below and spaced apart from the center quill 26 so the device 500 may be easily removed from the holding unit 25.

Considering now the chip removal tool 24 in greater detail with reference to FIGS. 1-6, the carrier device 500 is substantially similar to the carrier device more fully described in U.S. Pat. No. 4,937,108 and generally includes a front frame member 512 defining a front opening 514 and a back frame member 516 defining a back opening 518. Frame members 512 and 516 define a pair of planar surfaces 520 and 522 respectively.

Figure 6:
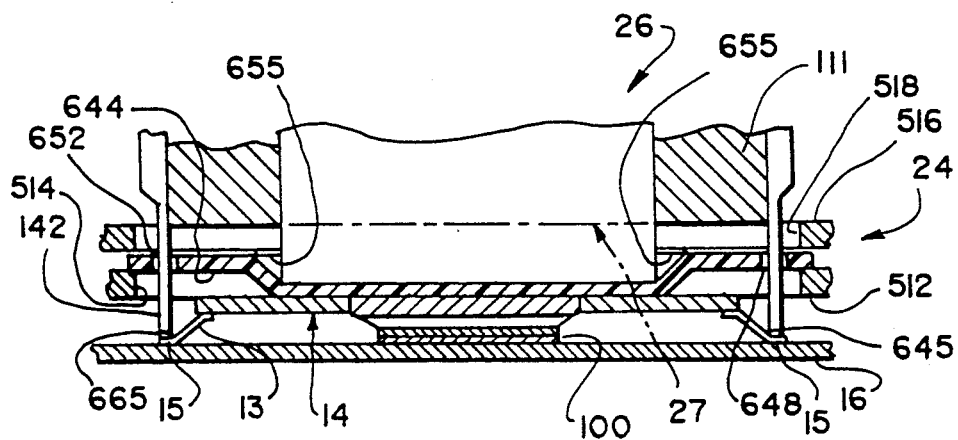
FIG. 6 is an enlarged cross sectional view of the heated center quill of FIG. 1 engaging the die removal material and printed circuit board assembly.

The carrier device includes hinge members 517 and 519 which enable the frame members 512 and 516 to move relative to one another as indicated by the arrow (FIG. 6).

The hinge members 517 and 519 include hinge pins 524 and 526 (FIG. 5) which are connected to frame member 512 by protrusions so that the hinge pins are spaced from the planar surface thereof. The hinge members 517 and 519 further comprise sockets 528 and 530 connected to frame member 516. The sockets 528 and 530 project outwardly from frame member 516 as shown, and are adapted to receive hinge pins 524 and 526 respectively.

As best seen in FIG. 5, each of the sockets 528 and 530 define an elongated interior (not shown) for facilitating selective placement of the hinge pins 524 and 526 into the socket interiors and the removal of the hinge pins 524 and 526 from the socket interiors.

The chip removal material 600 is composed of a sheet of thermoplastic material 644 with a high temperature resistance, such as PEEK TM. The plastic material 644 has a pair of rows 680 and 690 of preformed sheet locating holes therein, such as holes 602–610 and 612–620 respectively. The holes 602–610 and 612–620 accommodate a set of sheet locator pins 554–559 which project outwardly from the planar surface 522. The sheet of chip removal material 600 occupies the area on frame member 512 delineated by the phantom line A shown in FIG. 5. It will be appreciated by those skilled in the art, that other size or types of sheets of material may be supported within the carrier device 500. For example, a sheet may have performed holes which would be positioned over optional sheet locator pins 558–561 which project outwardly from the planar surface 522. Sheet locator pins 554–557 and 558–561 enter into corresponding apertures 564–567 and 568–571 respectively in frame member 512 when members 512 and 516 are clamped or snapped together.

After the strip of material 600 is in place, the frame members 512 and 516 are pivoted together as shown by the arrow until such frame members 512 and 516 are brought into abutting engagement with one another with the sheet of material 600 disposed therebetween.

The frame members 512 and 516 are then moved rectilinearly toward one another until the locator pins 554–561 snap into locking engagement with the apertures 564–571 respectively. In this position (FIG. 6) the sheet of material 600 is held in a firm stationary position between the frame members 512 and 516 with substantially the entire inward surface area defined by the holes 602–610 and 612–620 being disposed between the openings 514 and 518.

In order to help facilitate the removal of a sheet of material, such as sheet 600 from the carrier 500, the frame member 516 includes a plurality of air hole 580–587 so positioned as to underlie the sheet of material 600 and to provide a passageway allowing the application of pressured air to the underside of the sheet of material. Thus, in operation after the carrier device 500 has been opened, a source of pressurized air (not shown) at the test station 30 may be applied to the underside of frame member 516 to efficiently and easily remove the sheet of material 600 from the frame member 516.

Once the sheet of material has been removed from the carrier with the device 14 attached thereto, a new sheet of material 601 may be inserted within the carrier 500 for another chip removal operation. As best seen in FIG. 6, the sheet of material, such as sheet 600 are stored in a web or roll 601 so that individual sheets may be easily severed or separated therefrom.

Figure 4:
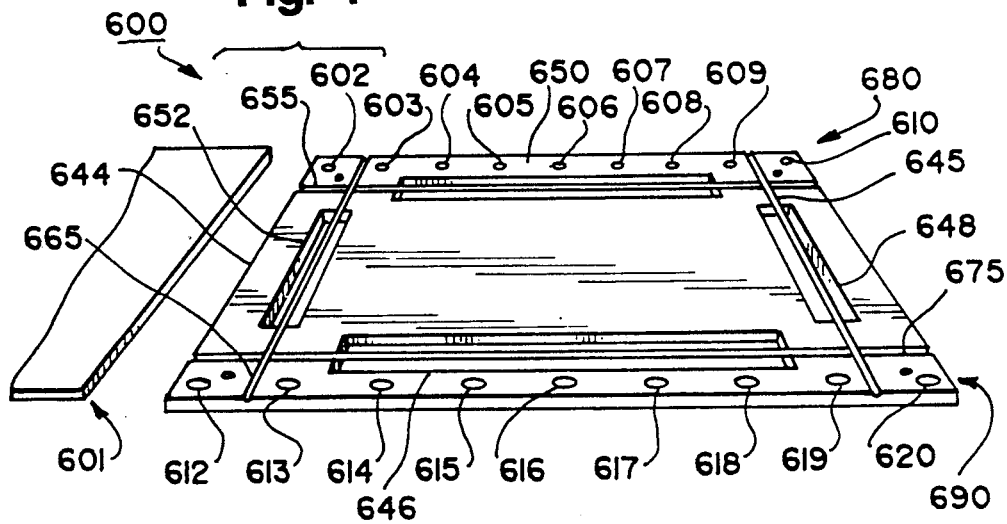
FIG. 4 is a pictorial view of a sheet of chip removal material which is constructed in accordance with the present invention and which is shown separated from an associated web of like sheets of material.

Considering now the sheet 600 in greater detail with reference to FIG. 4, the sheet 600 is generally a rectangularly shaped sheet of thermoplastic bonding material 644 having a high melting temperature. The sheet 600 also includes a pair of oppositely disposed substantially parallel cutout sections 64 and 650 respectively. The cutout sections 646 and 650 have a generally elongated rectangular shape with a sufficient dimension to permit a thermode blade, such as blade 142 to pass therethrough. The cutout sections 646 and 650 are disposed adjacent to holes 604–608 and 614–618 respectively. The sheet 600 also includes another pair of oppositely disposed cutout sections 648 and 652 which are disposed perpendicular to cutout sections 646 and 650. Cutout section 648 and 652 are dimensioned substantially the same as cutout sections 646 and 650.

In order to cause the solder material 15 bonding the leads 13 to the printed circuit board 16 to repel from the leads 13 when heated to liquefying temperatures, the sheet 600 also includes a set of solder removing materials 646, 655, 665 and 675 respectively. The solder removing materials 645, 655, 665 and 675 are configured in narrow strips and are bonded to the thermoplastic material 660 by conventional bonding techniques, such as ultrasonic bonding. The solder removing material such as 646 is composed of a material sold under the tradename SOLDERWICK TM.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A chip removal apparatus for use with a robotic unit, having a heated center quill for disabling the binding characteristics of a heat set type adhesive material bonding a chip body to a printed circuit board and a soldering unit with a plurality of thermode blades for liquefying solder bonding a plurality of chip leads extending from the chip body to the printed circuit board, comprising:

a sheet of wick supporting material having at least a pair of parallel, spaced-apart elongated thermode blade receiving openings for permitting the plurality of thermode blades to pass therethrough;

a plurality of narrow imperforate wick strips composed of solder dispersion material fastened in overlying relationship to said sheet in alignment with individual ones of said openings for causing liquefied solder to repel from the strips when the blades extend through their openings to carry the strips into engagement with the solder;

mounting means disposed below the solder unit and the center quill for securing said sheet releasably to the robotic unit;

and for permitting the center quill to be attached to the chip body removably;

whereby the robotic unit can cause the center quill to disable the heat set type adhesive thereby causing the center quill, to be attached to the body portion of the chip, and the thermode blades to liquify the solder thereby permitting the robotic unit to separate the chip from the printed circuit board without damaging the body portion of the chip or leaving broken leads.

2. A chip removal apparatus according to claim 1, wherein the heated center quill is pneumatically actuated to permit the center quill to move rectilinearly along a path of travel substantially perpendicular to the body of the chip.

3. A chip removal apparatus according to claim 2, wherein the heated center quill includes a heating unit for causing said adhesive material to be sufficiently heated to disable its bonding characteristics.

4. A chip removal apparatus according to claim 3, wherein said heating unit includes a plurality of air passageways for facilitating the removal of the chip from the printed circuit board by vacuum pressure.

5. A chip removal apparatus according to claim 3, wherein said heating unit includes a plurality of heating coils for radiating a sufficient amount of thermal energy to cause the bonding characteristics of said heat set type adhesive material to be disabled for chip removal purposes.

6. A chip removal apparatus according to claim 5, wherein said head set type adhesive material is a paste adhesive material.

7. A chip removal apparatus according to claim 6, wherein said paste adhesive material is STAY-STICK TM.

8. A chip removal apparatus according to claim 5, wherein said heat set type adhesive material is a film adhesive material.

9. A chip removal apparatus according to claim 8, wherein said film adhesive material is a thermoplastic material.

10. A chip removal apparatus according to claim 1 wherein said mounting means includes carrier means for clamping said sheet of wick supporting material in a stationary position to permit said thermode blades to be properly aligned with their openings.

11. A chip removal apparatus according to claim 10, wherein said carrier means includes means defining an opening for helping to facilitate relative movement between said carrier means and the plurality of thermode blades.

12. A chip removal apparatus according to claim 11, wherein said sheet of wick supporting material is disposed in confronting relationship with said means defining an opening.

13. A chip removal apparatus according to claim 11, wherein said heated center quill includes vacuum means for enabling said heated center quill to be attached releasably to the body portion of the chip.

14. A chip removal apparatus according to claim 11, wherein said sheet of wick supporting material includes means for enabling said heated center quill to be attached releasably to the body portion of the chip.

15. A chip removing device for use with a carrier device to releasably hold the removing in a stationary manner, comprising:

a sheet of chip removal material having a plurality of thermode blade receiving openings for permitting a plurality of thermode blades to pass therethrough; and strips of solder dispersion material for causing liquefied solder to repel therefrom;

said strips of solder dispersion material being mounted to said sheet of chip removal material and disposed substantially within the entranceways of each individual one of said plurality of thermode blade receiving openings for engagement with said thermode blades.

16. A chip removal device according to claim 15, wherein said sheet of chip removal material is a sheet of thermoplastic material.

17. A chip removal device according to claim 16, wherein said thermoplastic material is a high temperature resistance material.

18. A chip removal device according to claim 17, wherein said high temperature resistance material is PEEK TM.

19. A chip removal device according to claim 15, further comprising a pair of rows of preformed sheet locating holes for helping to facilitate the proper alignment of said sheet of chip removal material in said carrier device.

20. A chip removal device according to claim 15, wherein said sheet of chip removal material is severable from a web of like sheets of chip removal material.

* * * * *